United States Patent
Tu et al.

(10) Patent No.: US 10,770,366 B2
(45) Date of Patent: *Sep. 8, 2020

(54) INTEGRATED CIRCUIT PACKAGES AND METHODS FOR FORMING THE SAME

(71) Applicant: Taiwan Semiconductor Manufacturing Company, Ltd., Hsinchu (TW)

(72) Inventors: Chia-Wei Tu, Chunan (TW); Hsien-Wei Chen, Hsinchu (TW); Tsung-Fu Tsai, Changhua (TW); Wen-Hsiung Lu, Tainan (TW); Yian-Liang Kuo, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/694,349

(22) Filed: Nov. 25, 2019

(65) Prior Publication Data

US 2020/0091027 A1    Mar. 19, 2020

Related U.S. Application Data

(60) Continuation of application No. 16/022,796, filed on Jun. 29, 2018, now Pat. No. 10,510,635, which is a
(Continued)

(51) Int. Cl.
*H01L 23/31* (2006.01)
*H01L 23/00* (2006.01)
(Continued)

(52) U.S. Cl.
CPC .......... *H01L 23/3135* (2013.01); *H01L 21/78* (2013.01); *H01L 23/585* (2013.01); *H01L 24/05* (2013.01); *H01L 24/15* (2013.01); *H01L 23/3107* (2013.01); *H01L 23/3157* (2013.01); *H01L 24/03* (2013.01); *H01L 24/13* (2013.01); *H01L 2224/02331* (2013.01); *H01L 2224/02377* (2013.01); *H01L 2224/03* (2013.01); *H01L 2224/0401* (2013.01); *H01L 2224/05* (2013.01); *H01L 2224/0502* (2013.01); *H01L 2224/05022* (2013.01); *H01L 2224/05099* (2013.01); *H01L 2224/05124* (2013.01); *H01L 2224/05144* (2013.01); *H01L 2224/05147* (2013.01); *H01L 2224/05186* (2013.01); *H01L 2224/05548* (2013.01); *H01L 2224/05552* (2013.01); *H01L 2224/05567* (2013.01); *H01L 2224/05573* (2013.01); *H01L 2224/05582* (2013.01); *H01L 2224/05599* (2013.01);
(Continued)

(58) Field of Classification Search
None
See application file for complete search history.

(56) References Cited

U.S. PATENT DOCUMENTS 5,300,461 A    4/1994 Ting
7,301,222 B1    11/2007 Patwardhan et al.
(Continued)

*Primary Examiner* — Mounir S Amer
(74) *Attorney, Agent, or Firm* — Slater Matsil, LLP

(57) ABSTRACT

A method includes forming an electrical connector over a substrate of a wafer, and molding a polymer layer, with at least a portion of the electrical connector molded in the polymer layer. A first sawing step is performed to form a trench in the polymer layer. After the first sawing step, a second sawing step is performed to saw the wafer into a plurality of dies.

20 Claims, 10 Drawing Sheets

Related U.S. Application Data continuation of application No. 15/722,472, filed on Oct. 2, 2017, now Pat. No. 10,056,312, which is a continuation of application No. 14/949,260, filed on Nov. 23, 2015, now Pat. No. 9,780,009, which is a division of application No. 13/529,179, filed on Jun. 21, 2012, now Pat. No. 9,196,532.

(51) Int. Cl.
*H01L 21/78* (2006.01)
*H01L 23/58* (2006.01)

(52) U.S. Cl.
CPC ............... *H01L 2224/05647* (2013.01); *H01L 2224/13022* (2013.01); *H01L 2224/13024* (2013.01); *H01L 2224/13111* (2013.01); *H01L 2224/16225* (2013.01); *H01L 2224/94* (2013.01); *H01L 2924/00014* (2013.01); *H01L 2924/01029* (2013.01); *H01L 2924/01047* (2013.01); *H01L 2924/14* (2013.01)

(56) References Cited

U.S. PATENT DOCUMENTS

| | | |
|---|---|---|
| 9,780,009 B2 | 10/2017 | Tu et al. |
| 10,056,312 B2 | 8/2018 | Tu et al. |
| 2002/0197771 A1 | 12/2002 | Dotta et al. |
| 2003/0216010 A1 | 11/2003 | Atlas |
| 2006/0189099 A1 | 8/2006 | Lu et al. |
| 2008/0169477 A1 | 7/2008 | Wang et al. |
| 2008/0194060 A1 | 8/2008 | Shimanuki |
| 2008/0213976 A1 | 9/2008 | Farnworth |
| 2009/0057842 A1 | 3/2009 | He et al. |
| 2010/0072635 A1 | 3/2010 | Kuo et al. |
| 2010/0171203 A1 | 7/2010 | Chen et al. |
| 2010/0181681 A1 | 7/2010 | Akiba et al. |
| 2011/0034027 A1 | 2/2011 | Kuo et al. |
| 2013/0049195 A1 | 2/2013 | Wu et al. |
| 2013/0341800 A1 | 12/2013 | Tu et al. |

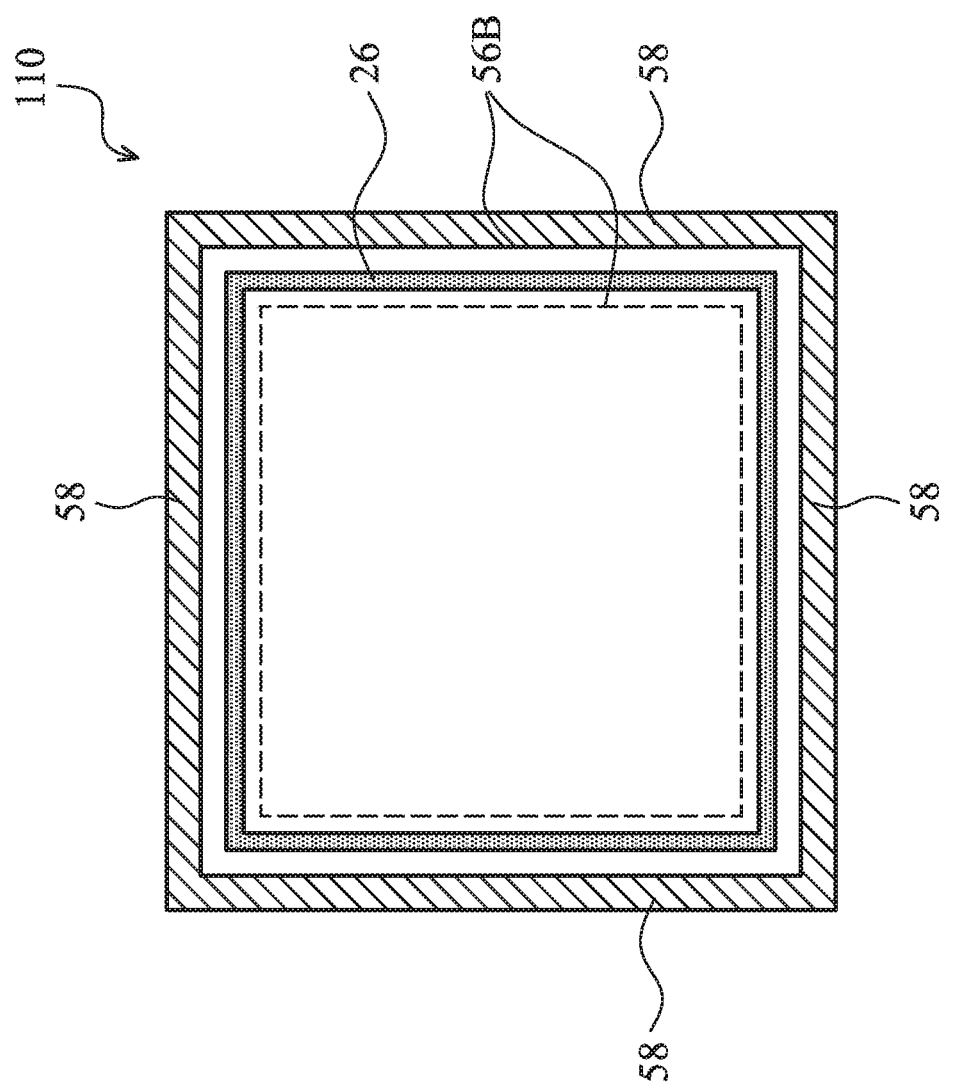

INTEGRATED CIRCUIT PACKAGES AND METHODS FOR FORMING THE SAME

PRIORITY CLAIM AND CROSS-REFERENCE

This application is a continuation of U.S. patent application Ser. No. 16/022,796, entitled "Integrated Circuit Packages and Methods for Forming the Same," filed on Jun. 29, 2018, which is a continuation of U.S. patent application Ser. No. 15/722,472, entitled "Integrated Circuit Packages and Methods for Forming the Same," filed on Oct. 2, 2017, now U.S. Pat. No. 10,056,312 issued Aug. 21, 2018, which is a continuation of U.S. patent application Ser. No. 14/949,260, entitled "Integrated Circuit Packages and Methods for Forming the Same," filed on Nov. 23, 2015, now U.S. Pat. No. 9,780,009 issued Oct. 3, 2017, which application is a divisional of U.S. patent application Ser. No. 13/529,179, entitled "Integrated Circuit Packages and Methods for Forming the Same," filed on Jun. 21, 2012, now U.S. Pat. No. 9,196,532 issued Nov. 24, 2015, which applications are incorporated herein by reference.

BACKGROUND

In the formation of wafer-level chip scale package structures, integrated circuit devices such as transistors are first formed at the surface of a semiconductor substrate in a wafer. An interconnect structure is then formed over the integrated circuit devices. A metal pad is formed over, and is electrically coupled to, the interconnect structure. A passivation layer and a first polyimide layer are formed over the metal pad, with the metal pad exposed through the openings in the passivation layer and the first polyimide layer.

A seed layer is then formed on the first polyimide layer, followed by the formation of Post-Passivation Interconnect (PPI) lines and pads. The PPI lines and pads may be formed by forming and patterning a first photo resist on the seed layer, plating the PPI lines and pads in the openings in the first photo resist, and then removing the first photo resist. The portions of the seed layer that were previously covered by the first photo resist are removed. Next, a second polyimide layer is formed over the PPI lines and pads, and an Under-Bump Metallurgy (UBM) is formed extending into an opening in the second polyimide layer. The UBM is electrically connected to the PPI lines and pads. A solder bump is then formed on the UBM.

The formation of the UBM also involves forming a UBM seed layer, forming and patterning a second photo resist, forming the UBM on the UBM seed layer, removing the second photo resist, and removing the portions of the UBM seed layer that were previously covered by the second photo resist.

In the above-discussed process steps, two photo resists are formed and removed, and two seed layers are formed and partially removed. The manufacturing cost is thus high. Accordingly, a molding compound is used to replace the second polyimide layer. The molding compound is applied after the solder bump is formed, and hence may protect the solder bump from the damage caused by stresses.

BRIEF DESCRIPTION OF THE DRAWINGS

For a more complete understanding of the embodiments, and the advantages thereof, reference is now made to the following descriptions taken in conjunction with the accompanying drawings, in which:

FIG. 10 illustrates a top view of a chip sawed from the wafer.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A package and the methods of forming the same are provided in accordance with an embodiment. The intermediate stages of manufacturing the package in accordance with various embodiments are illustrated. The variations of the embodiment are also discussed. Throughout the various views and illustrative embodiments, like reference numbers are used to designate like elements.

Figure 1:
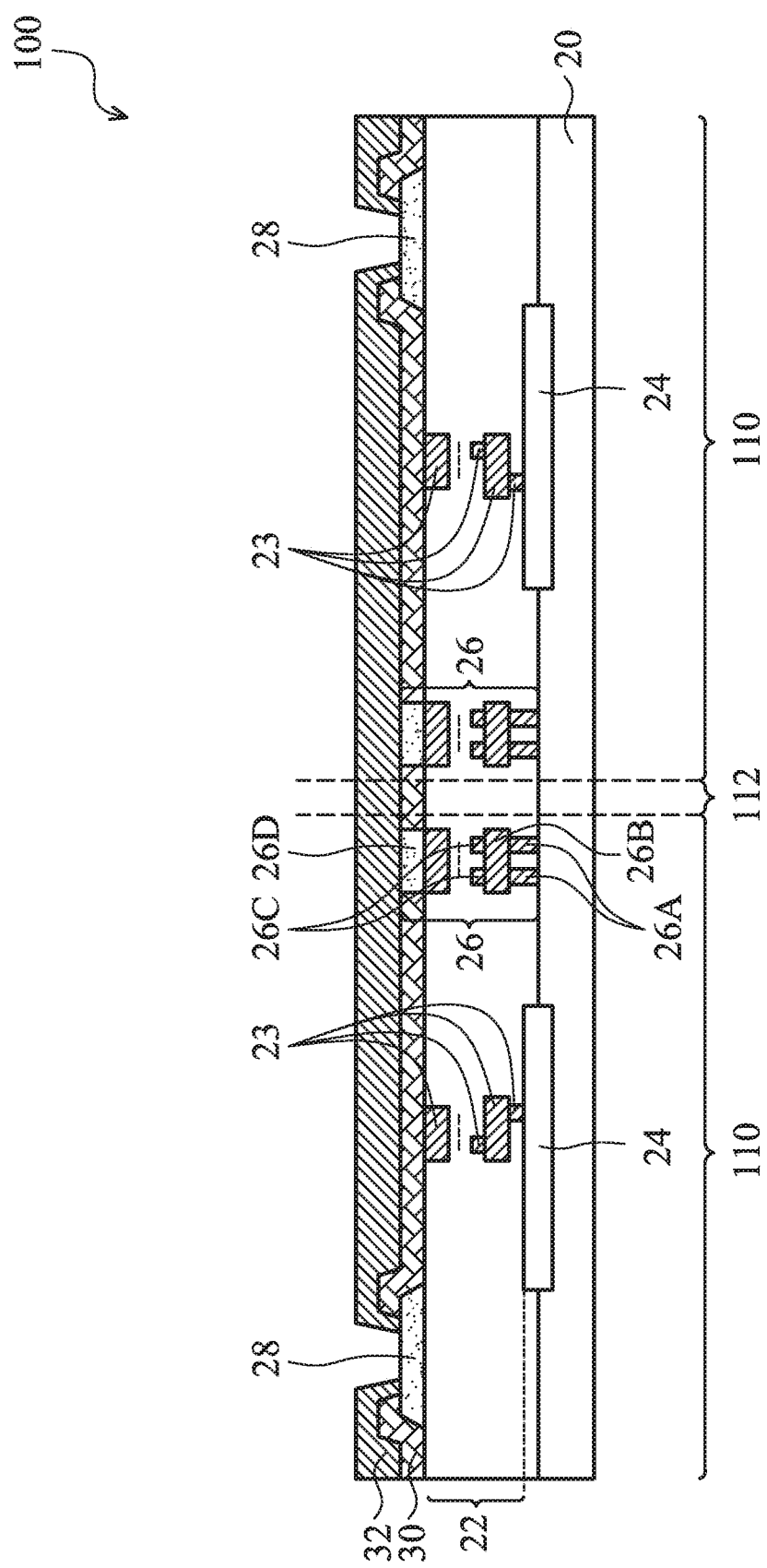
FIGS. 1 through 8 are cross-sectional views of intermediate stages in the manufacturing of a chip, and the bonding of the chip, in accordance with various embodiments.

Referring to FIG. 1, wafer 100 is provided. Wafer 100 includes a plurality of chips 110 identical to each other, with scribe line 112 separating neighboring chips 110 from each other. Wafer 100 includes substrate 20, which may be a semiconductor substrate, such as a silicon substrate, although it may be formed of other semiconductor materials such as silicon germanium, silicon carbon, gallium arsenide, or the like. Semiconductor devices 24, which include transistors, may be formed at the surface of substrate 20. Interconnect structure 22 is formed over substrate 20, and is electrically coupled to semiconductor devices 24. Interconnect structure 22 include metal lines and vias 23 formed therein. The metal lines and vias may be formed of copper or copper alloys, and may be formed using damascene processes. Interconnect structure 22 may include an interlayer dielectric (ILD) and inter-metal dielectrics (IMDs), which may comprise low-k dielectric materials. In alternative embodiments, wafer 100 is an interposer wafer or a package substrate, and is substantially free from integrated circuit devices including transistors, resistors, capacitors, inductors, and/or the like, formed therein.

Metal pad 28 is formed over interconnect structure 22. Metal pad 28 may comprise aluminum (Al), copper (Cu), silver (Ag), gold (Au), nickel (Ni), tungsten (W), alloys thereof, and/or multi-layers thereof. Metal pad 28 may be electrically coupled to semiconductor devices 24, for example, through the underlying interconnect structure 22. Passivation layer 30 may be formed to cover edge portions of metal pad 28. In an exemplary embodiment, passivation layer 30 is formed of a silicon oxide layer and a silicon nitride layer over the silicon oxide layer, although other dielectric materials may be used. An opening is formed in passivation layer 30.

Figure 9:
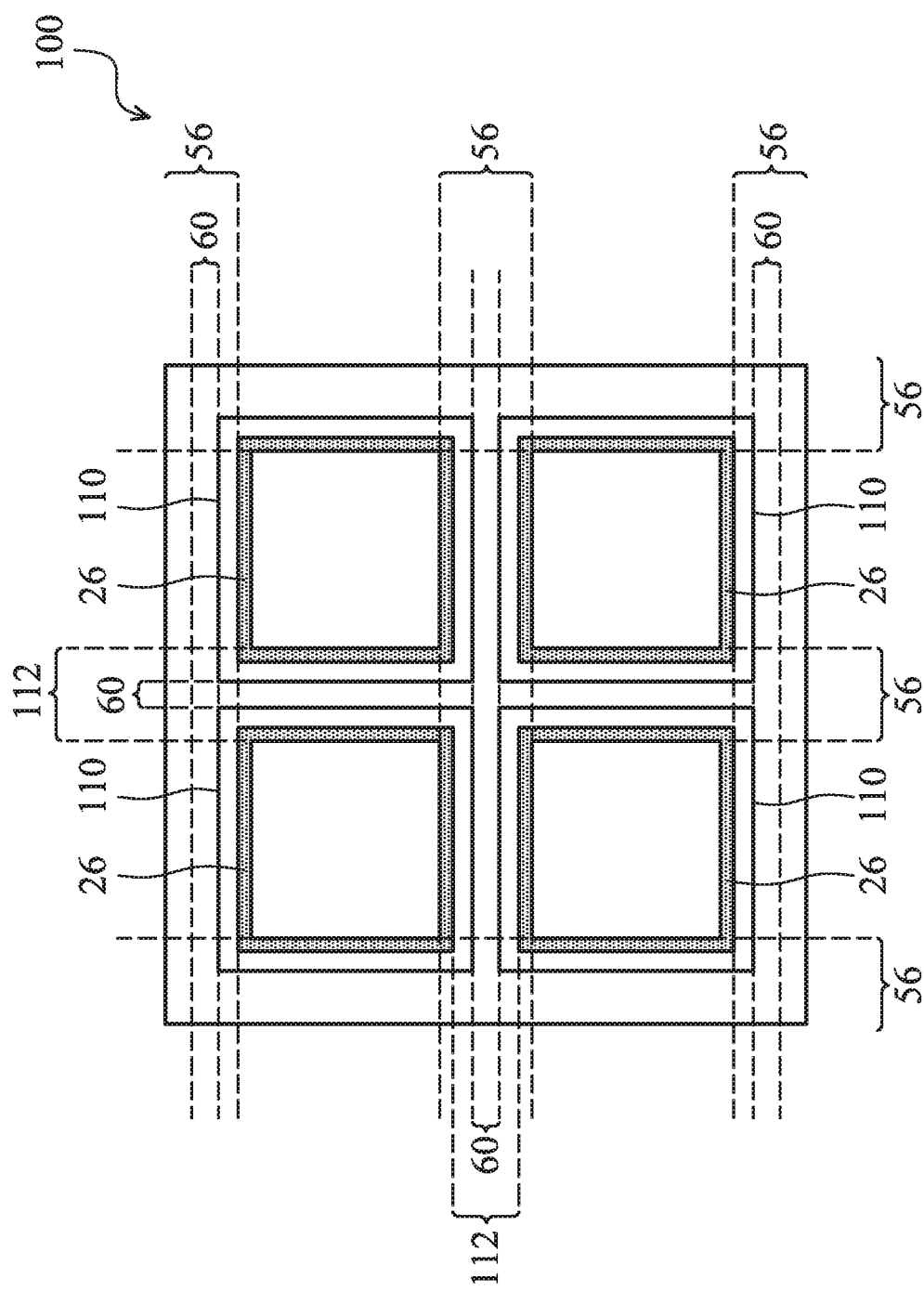
FIG. 9 illustrates a top view of a wafer.

Each of chips 110 includes a seal ring 26 that is formed adjacent to the respective peripheral region. It is appreciated that each of chips 110 may include more seal rings, with the outer seal rings encircling the inner seal rings, although one seal ring 26 is illustrated. Referring to FIG. 9, which is a top view of wafer 100, each of seal rings 26 may have four edges, each being close to, and parallel to, one edge of the respective chip 110. As shown in FIG. 1, seal ring 26 may include a plurality of portions that are stacked, which portions may include contact plugs 26A, metal lines 26B, metal vias 26C, metal line 26D, and/or the like. Contact plugs 26A may be in contact with substrate 20 in some embodiments. Metal line 26D is over the top metal layer of interconnects structure 22, and is formed in passivation layer 30. Furthermore, metal line 26D is formed simultaneously as, and is formed of a same material as, metal pad 28. Metal line 26 may be omitted in alternative embodiments. Each of contact plugs 26A, metal lines 26B, metal vias 26C, and metal line 26D may form a full ring. The rings of contact plugs 26A, metal lines 26B, metal vias 26C, and metal line 26D are interconnected, so that the entire seal ring 26 is a closed-loop ring.

Polymer layer 32 is formed over passivation layer 30. In some embodiments, polymer layer 32 is a polyimide layer, and hence is referred to as polyimide layer 32 hereinafter, although it may also be formed of other polymers. Polyimide layer 32 extends into the opening in passivation layer 30. A center portion of metal pad 28 is not covered by polyimide layer 32.

Figure 2:
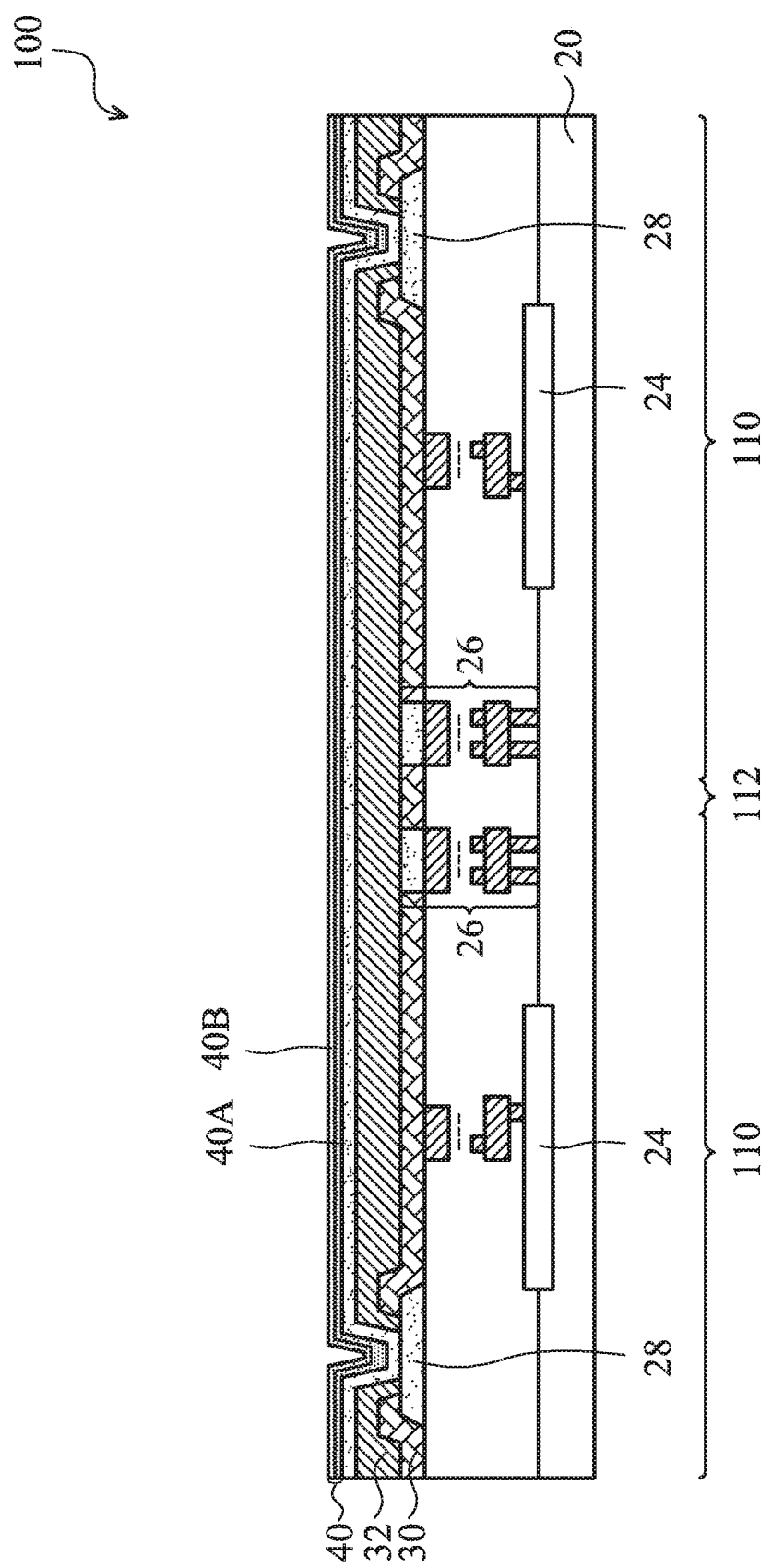

Next, as shown in FIG. 2, seed layer 40 is blanket formed over polyimide layer 32. Seed layer 40 may include layers 40A and 40B. Layer 40A may be a titanium layer, a titanium nitride layer, a tantalum layer, a tantalum nitride layer, or the like. The materials of layer 40B may include copper or copper alloys. In some embodiments, seed layer 40 is formed using physical vapor deposition, although other applicable methods may also be used.

Figure 3:
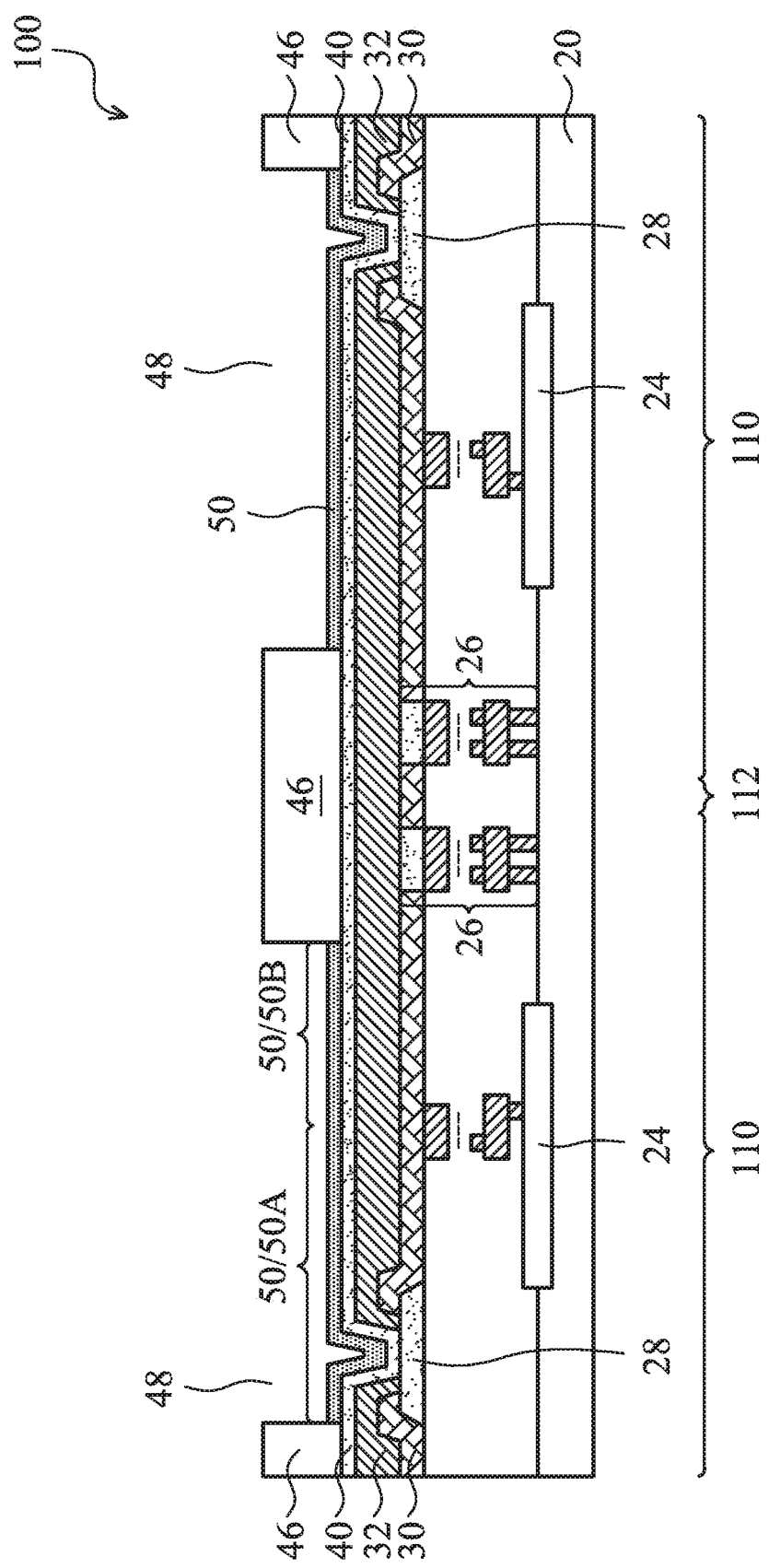

FIG. 3 illustrates the formation of mask 46. In some embodiments, mask 46 is formed of a photo resist, and hence is alternatively referred to as photo resist 46 throughout the description, although other materials such as dry films may be used. A portion of seed layer 40 is exposed through opening 48 in mask 46. Next, a plating step is performed to form Post-Passivation Interconnect (PPI) 50 in opening 48. PPI 50 may be formed of copper or copper alloys, and may include PPI line 50A and PPI pad 50B.

Figure 4:
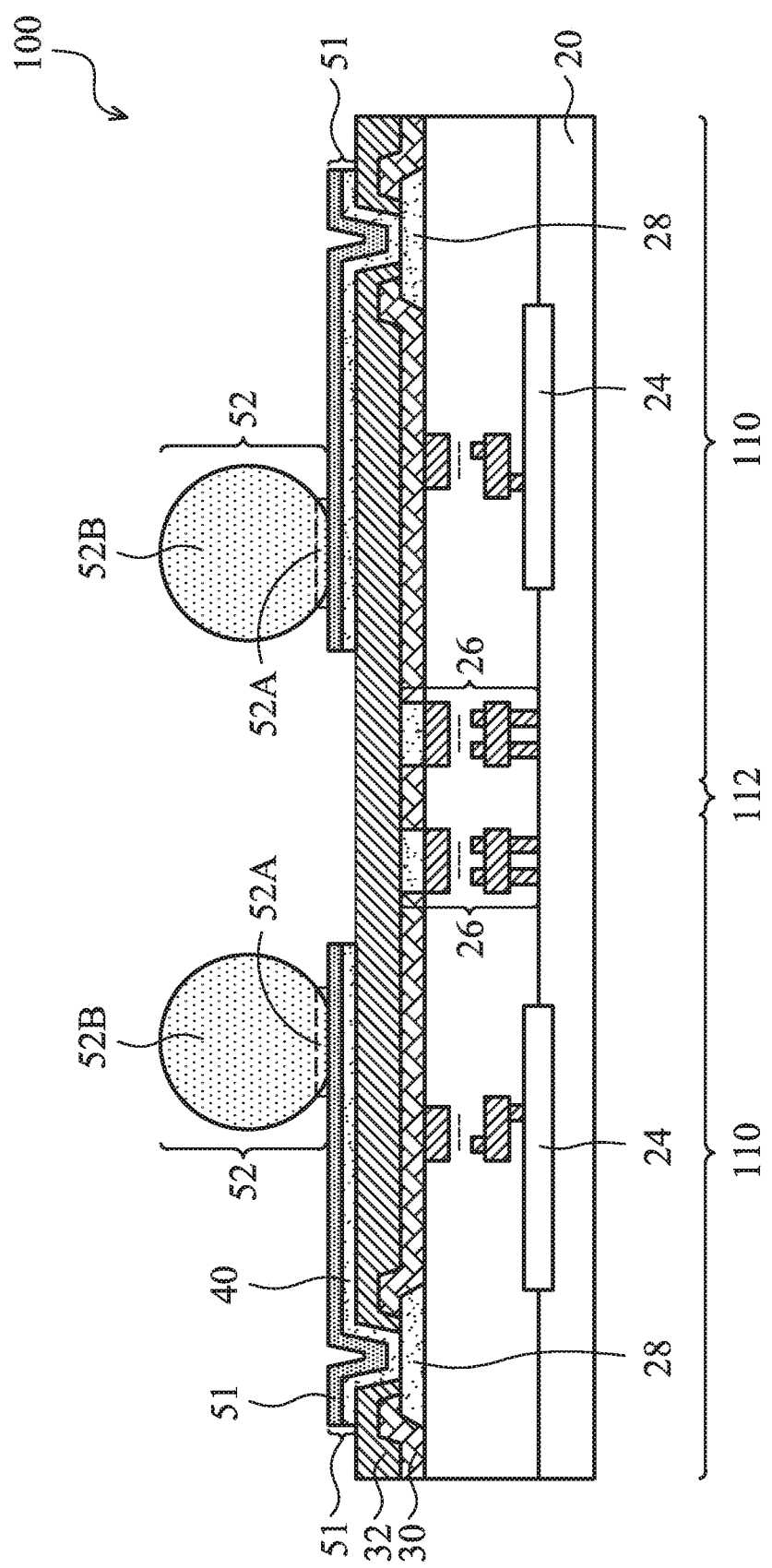

Referring to FIG. 4, after the formation of PPI 50, mask 46 is removed. Next, the exposed portions of seed layer 40 that were previously covered by mask 46 are removed using etching, while the portions of seed layer 40 covered by PPI 50 remain un-removed. Throughout the description, PPI 50 and the underlying remaining portions of seed layer 40 are in combination referred to as PPI 51.

FIG. 4 illustrates the formation of electrical connector 52, which is over and electrically coupled to PPI 51. In some embodiments, electrical connector 52 comprises a solder bump, which may be placed on PPI 51 (such as on PPI pad 51B) and reflowed. The solder bump may comprise Sn—Ag, Sn—Ag—Cu, or the like, and may be lead-free or lead-containing. In some embodiments, electrical connector 52 may also include an additional metal portion (schematically illustrated as 52A) underlying the solder bump (schematically illustrated as 52B), wherein the additional metal portion 52A may comprise a nickel layer, a palladium layer, a titanium layer, a tantalum layer, combinations thereof, and/or multi-layers thereof. Metal portion 52A may be plated on PPI 51 by forming an additional mask layer (not shown) on PPI 51, and plating metal portion 52 in the opening in the additional mask layer. The additional mask layer is then removed. In the embodiments in which metal portion 52A is formed, the solder bump 52B may also be formed by plating, followed by reflowing.

Figure 5:
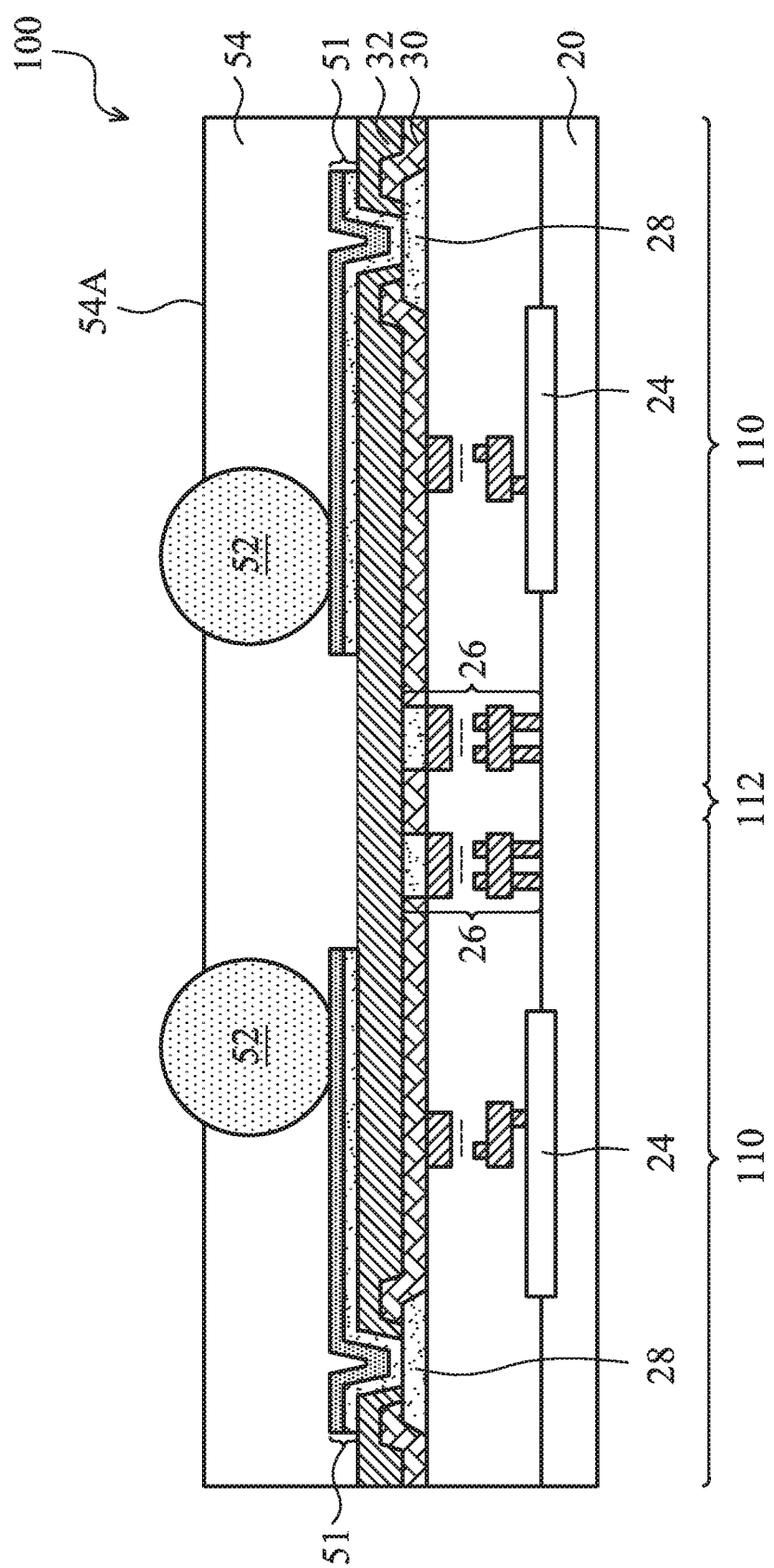

Next, as shown in FIG. 5, polymer layer 54 is applied on wafer 100, and then cured. The bottom surface of polymer layer 54 may be in contact with the top surface of PPI 51 and/or the top surface of polymer layer 32. After the formation of polymer layer 54, electrical connector 52 may have a top portion over the top surface 54A of polymer layer 54, and a bottom portion in polymer layer 54. In some embodiments, polymer layer 54 comprises a liquid molding compound, which is such named because it has a low viscosity than some other molding compounds at the time it is dispensed. The liquid molding compound is also cured as a solid after dispensing. Polymer layer 54 may be formed using compress molding, transfer molding, or the like.

Figure 6:
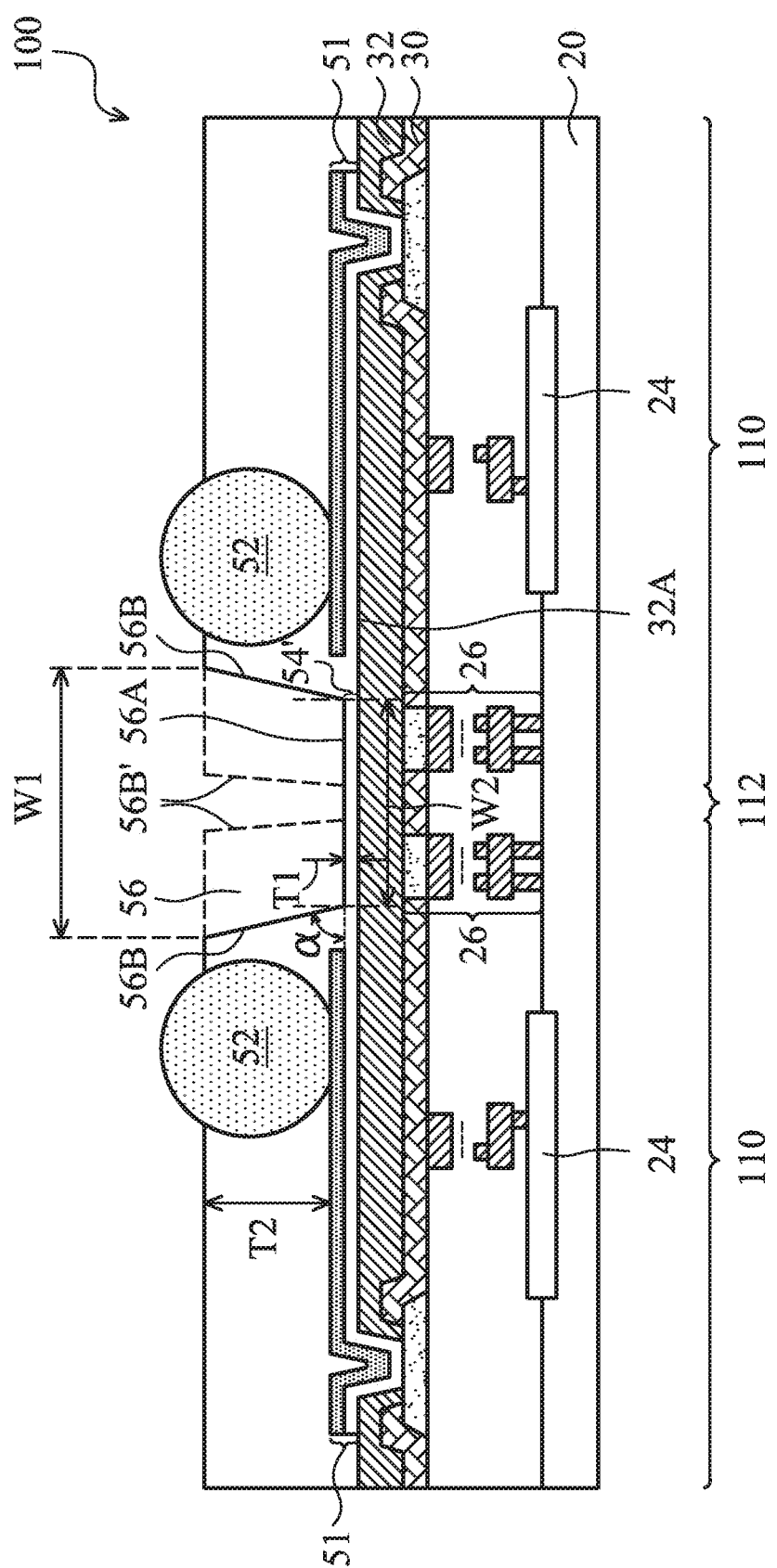

In FIG. 6. A first sawing step is performed to form trench 56 in polymer layer 54. In some embodiments, trench 56 is formed using a blade to saw polymer layer 54. Bottom 56A of trench 56 is higher than top surface 32A of polymer layer 32. Accordingly, a remaining layer 54' of polymer layer 54 is left underlying trench 56. Thickness T1 of the remaining layer 54' may be between about 1 percent and about 40 percent thickness T2 of polymer layer 54. Thickness T1 may also be between about 1 µm and about 30 µm in some embodiments, although thickness T1 may be greater or smaller. Thickness T1 is also small enough, so that the remaining polymer layer 54' is transparent. Accordingly, the features such as seal ring 26 or alignment marks (not shown) that are at the same level as metal pads 28 and underlying trench 56 are visible through the remaining polymer layer 54' and polymer layer 32. On the other hand, the un-sawed portion of polymer 54 that has thickness T2 is opaque, and the underlying features are not visible.

In some embodiments, the cross-sectional view of trench 56 has an inverse trapezoid shape, with top width W1 greater than bottom width W2. Bottom surface 56A of trench 56 may be substantially flat, as illustrated, or may be sloped. Edges 56B of trench 56 may be slanted, as shown in FIG. 6. Slant angle α of edges 56B may be between 1 degree and about 90 degrees. Alternatively, edges 56B of trench 56 may be substantially perpendicular to bottom surface 56A of trench 56.

Trench 56 comprises a portion in scribe line 112. Furthermore, trench 56 may extend into chips 110 that are on the opposite sides of scribe line 112. In some embodiments, trench 56 overlaps a portion of seal ring 26. The edge 56B of trench 56 may overlap seal ring 26, or may be on the inner side (the left side of left seal ring 26 and the right side of right seal ring 26) of seal ring 26. In alternative embodiments, trench 56 does not overlap seal ring 26, and dashed lines 56B' schematically illustrate the positions of the edges of trench 56 in these embodiments.

Figure 7:
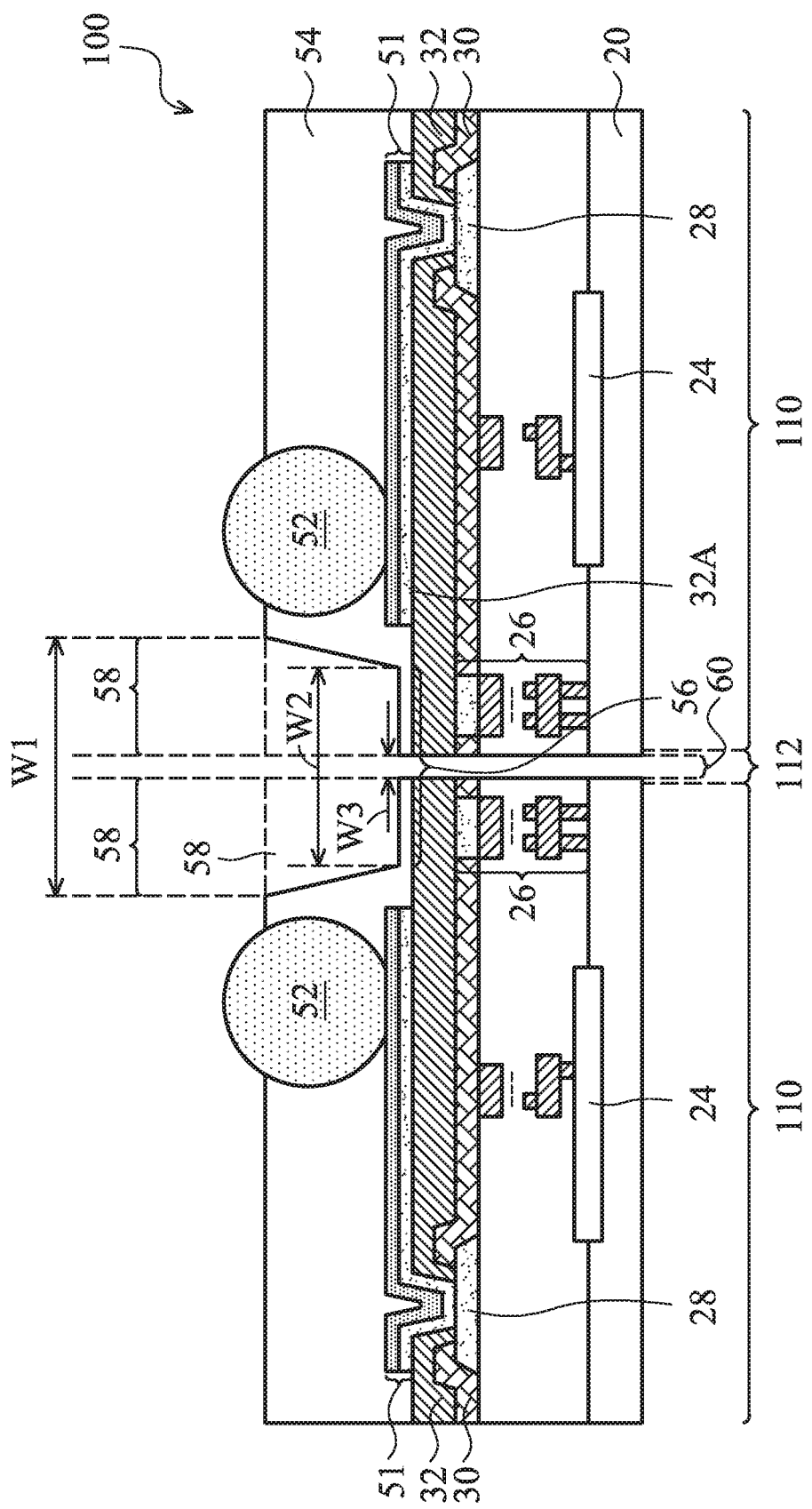

Referring to FIG. 7, a die saw step (a second sawing step) is performed to saw wafer 100 into a plurality of dies 110, with kerf 60 formed in the second sawing step. FIG. 9 illustrates a top view of wafer 100, wherein the positions of exemplary scribe lines 112, trenches 56, seal rings 26, kerves 60, and the like, are schematically illustrated. Referring again to FIG. 7, kerf 60 is inside scribe lines 112, and width W3 of the kerf 60 is smaller than top width W1 and bottom width W2 of trench 56. After the sawing step, notches 58 are formed in polymer layer 54 as a result of trench 56, wherein notches 58 extend from edges of dies 110 inwardly toward the center of the respective dies 120. Furthermore, as shown in FIG. 10, which is the top view of one of dies 110, notches 58 on the four sides of die 110 are interconnected to form a notch ring, wherein edges 56B of the notch ring may be tilted. In the illustrated embodiments in FIG. 10, edges 56B that are shown with solid lines are on the outer sides of seal ring 26. In alternative embodiments, edges 56B may overlap seal ring 26, in on the inner sides of the seal ring 26, as shown with dashed lines.

Figure 8:
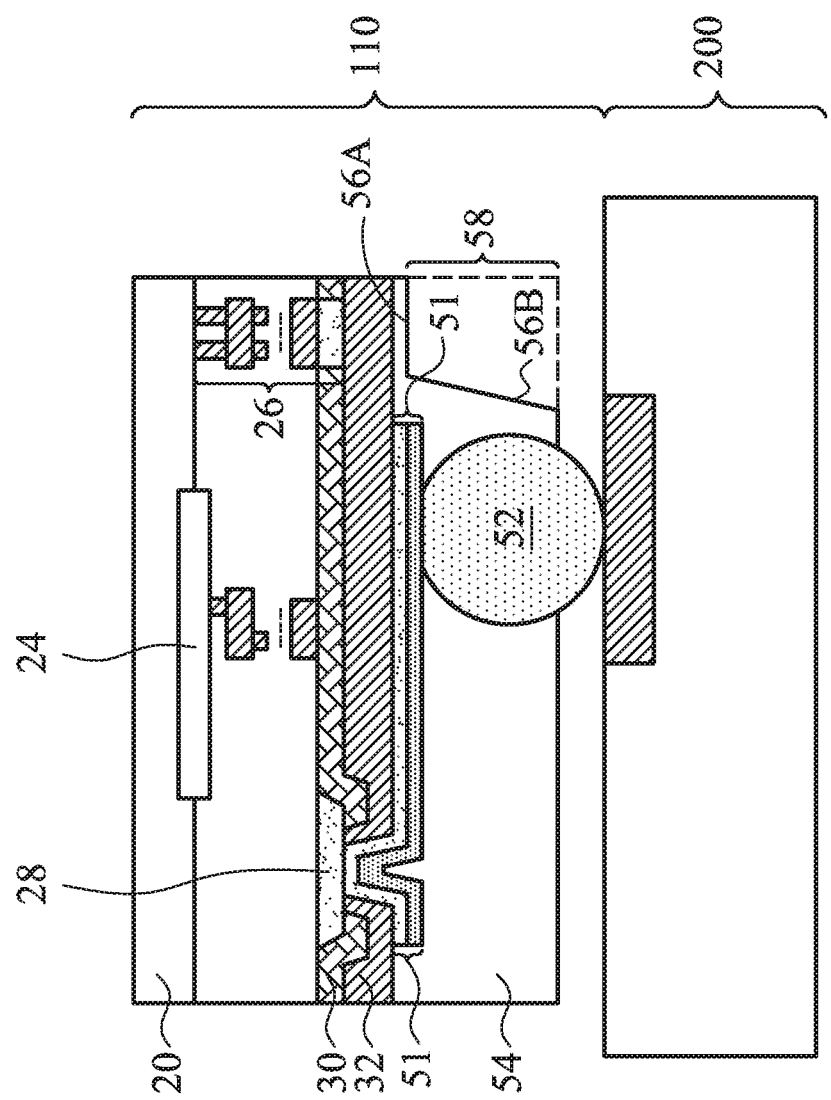

FIG. 8 illustrates the bonding of die 110 to package component 200, which may be a package substrate (a laminate substrate or a build up substrate, for example), a Printed Circuit Board (PCB), or the like. During the bonding process, electrical connector 52 may be reflowed to join die 110 with package component 200. Notch 58 is illustrated in FIG. 8.

In the embodiments, two sawing steps are performed. The first sawing step results in the thinning of the portion of polymer layer 54 that is close to the peripheral of chips 110 (FIG. 7), and possibly the portion of polymer layer 54 that overlaps seal ring 26. The thinned polymer layer 54 is at least partially transparent due to its small thickness. Accordingly, seal ring 26 and/or other alignment marks under polymer layer 54 may be visible when the second sawing step is performed. The seal ring and/or the alignment marks may be used for alignment in the second sawing step. Better alignment may thus be achieved. This results in the reduction in the accidental sawing on seal ring 26 due to the misalignment. Furthermore, since polymer layer 54 and substrate 20 (which may be a silicon substrate) have a significant mismatch in their Coefficients of Thermal Expansion (CTE), when die 110 is bonded to package component 200, die 110 may have die edge crack, which may propagate to the center of die 110, causing yield loss. With the first sawing step, however, the volume of polymer layer 54 is reduced, and the stress due to CTE mismatch is also reduced.

In accordance with embodiments, a method includes forming an electrical connector over a substrate of a wafer, and molding a polymer layer, with at least a portion of the electrical connector molded in the polymer layer. A first sawing step is performed to form a trench in the polymer layer. After the first sawing step, a second sawing step is performed to saw the wafer into a plurality of dies.

In accordance with other embodiments, a method includes forming a Post-Passivation Interconnect (PPI) over a substrate of a wafer, forming an electrical connector over and electrically coupled to the PPI, and molding a polymer layer over the PPI, wherein a lower portion of the electrical connector is molded in the polymer layer. A first sawing step is performed to form a trench in the polymer layer, wherein the trench includes a portion in a scribe line between a first chip and a second chip of the wafer. After the first sawing step, a second sawing step is performed to saw through the scribe line and to separate the first and the second chips from each other, wherein a kerf of the second sawing step passes through a middle portion of the trench.

In accordance with yet other embodiments, a chip includes a substrate, an electrical connector over the substrate, and a polymer layer overlying the substrate. A lower portion of the electrical connector is in the polymer layer. A notch ring includes portions adjacent to edges of the chip. The notch ring further extends from edges of the chip inwardly toward a center of the chip.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a solder region on a wafer, wherein the wafer comprises a plurality of chips, with the solder region being in a first chip of the plurality of chips;
   forming a dielectric layer to embed a portion of the solder region in the dielectric layer, wherein the dielectric layer comprises a first portion and a second portion;
   thinning the first portion of the dielectric layer without thinning the second portion of the dielectric layer; and
   sawing the wafer to separate the plurality of chips from each other, wherein the sawing comprises using a feature underlying the thinned first portion of the dielectric layer for alignment.

2. The method of claim 1, wherein the thinning results in a trench to be formed in the dielectric layer, wherein the trench extends into the first chip.

3. The method of claim 2, wherein the trench further extends into a scribe line, with the scribe line separating the first chip and a second chip from each other.

4. The method of claim 1, wherein after the thinning, a remaining portion of the first portion of the dielectric layer is left, and has a thickness allowing the feature directly underlying the remaining portion to be visible through the remaining portion.

5. The method of claim 1, wherein before the thinning, the first portion of the dielectric layer is thick enough to prevent the feature from being visible through the first portion of the dielectric layer.

6. The method of claim 1, wherein the dielectric layer comprises a molding compound.

7. The method of claim 1, wherein the thinning is performed using a blade.

8. The method of claim 1, wherein the thinned first portion of the dielectric layer has a first thickness in a range between about 1 percent and about 40 percent of a second thickness of the second portion of the dielectric layer.

9. The method of claim 1, wherein the feature used for aligning comprises a seal ring in the first chip.

10. A method comprising:
    forming a first electrical connector and a second electrical connector on a first chip and a second chip of a wafer;
    molding the first electrical connector and the second electrical connector to be partially in a molding compound;
    performing a first sawing process to form a trench in the molding compound, wherein the trench comprises a first portion extending into the first chip, wherein after the first sawing process, a conductive feature is visible through a remaining portion of the molding compound directly underlying the trench; and
    after the first sawing process, performing a second sawing process to saw through a scribe line that separates the first chip and the second chip from each other, wherein in the second sawing process, the conductive feature is used as an alignment mark.

11. The method of claim 10, wherein the trench further extends into the scribe line, and a kerf of the second sawing process passes through the scribe line.

12. The method of claim 11, wherein the trench further extends into the second chip.

13. The method of claim 10, wherein the conductive feature comprises a seal ring.

14. The method of claim 10, wherein sidewalls of the trench are tilted, and wherein a bottom of the trench is substantially flat.

15. The method of claim 10, wherein the first sawing process is performed using a blade.

16. The method of claim 10, wherein before the first sawing process, the conductive feature is not visible through the molding compound.

17. The method of claim 10, wherein after the second sawing process, a notch ring is generated in a peripheral region of the first chip.

18. A method comprising:
   molding a wafer comprising a first chip and a second chip with a molding compound, wherein a solder region in the first chip is partially molded in the molding compound;
   performing a thinning process to thin the molding compound, until a feature underlying the molding compound is visible; and
   after the thinning process, performing a die-saw process to separate the first chip and the second chip from each other, wherein the feature is used as an alignment mark.

19. The method of claim 18, wherein when the feature is used as the alignment mark, a remaining portion of the molding compound remains directly over the alignment mark, and the feature is viewed through the remaining portion of the molding compound.

20. The method of claim 18, wherein before the thinning process, the feature is not visible through the molding compound.

\* \* \* \* \*